United States Patent
Tzeng

(10) Patent No.: US 7,622,151 B2
(45) Date of Patent: Nov. 24, 2009

(54) METHOD OF PLASMA ENHANCED CHEMICAL VAPOR DEPOSITION OF DIAMOND USING METHANOL-BASED SOLUTIONS

(75) Inventor: Yonhua Tzeng, Auburn, AL (US)

(73) Assignee: Auburn University, Auburn, AL (US)

( * ) Notice: Subject to any disclaimer, the term of this patent is extended or adjusted under 35 U.S.C. 154(b) by 316 days.

(21) Appl. No.: 10/772,740

(22) Filed: Feb. 5, 2004

(65) Prior Publication Data
US 2004/0157005 A1    Aug. 12, 2004

Related U.S. Application Data

(63) Continuation-in-part of application No. 09/501,114, filed on Feb. 10, 2000, now abandoned.

(60) Provisional application No. 60/119,771, filed on Feb. 10, 1999.

(51) Int. Cl.
*C23C 16/00* (2006.01)
*C23C 16/26* (2006.01)

(52) U.S. Cl. ............... 427/248.1; 427/249.1; 427/249.8; 427/249.12

(58) Field of Classification Search ............... 427/248.1, 427/249.1, 249.8, 249.12
See application file for complete search history.

(56) References Cited

U.S. PATENT DOCUMENTS 5,236,545 A * 8/1993 Pryor .......................... 117/95
5,451,260 A * 9/1995 Versteeg et al. .............. 118/725
5,874,014 A * 2/1999 Robson et al. ................ 216/68
6,284,315 B1  9/2001 Tzeng ..................... 427/249.1

FOREIGN PATENT DOCUMENTS

JP       05097583 A  *  4/1993

OTHER PUBLICATIONS

Tzeng, et al.; Effects of oxygen and hydrogen on electron field emission from microwave plasma chemically vapor deposited microcrystalline diamond, nanocrystalline diamond, and glassy carbon coatings.

* cited by examiner

*Primary Examiner*—Timothy Meeks
*Assistant Examiner*—Kelly M Gambetta
(74) *Attorney, Agent, or Firm*—Haverstock & Owens LLP

(57) ABSTRACT

Briefly described, methods of forming diamond are described. A representative method, among others, includes: providing a substrate in a reaction chamber in a non-magnetic-field microwave plasma system; introducing, in the absence of a gas stream, a liquid precursor substantially free of water and containing methanol and at least one carbon and oxygen containing compound having a carbon to oxygen ratio greater than one, into an inlet of the reaction chamber; vaporizing the liquid precursor; and subjecting the vaporized precursor, in the absence of a carrier gas and in the absence in a reactive gas, to a plasma under conditions effective to disassociate the vaporized precursor and promote diamond growth on the substrate in a pressure range from about 70 to 130 Torr.

23 Claims, 1 Drawing Sheet

METHOD OF PLASMA ENHANCED CHEMICAL VAPOR DEPOSITION OF DIAMOND USING METHANOL-BASED SOLUTIONS

CROSS-REFERENCE TO RELATED APPLICATION

This application is a Continuation-in-part of U.S. patent application Ser. No. 09/501,114, filed Feb. 10, 2000 now abandoned, and claims priority to the U.S. Provisional Patent Application No. 60/119,771, filed Feb. 10, 1999, both of which are incorporated herein by reference in their entirety.

STATEMENT REGARDING FEDERALLY SPONSORED RESEARCH OR DEVELOPMENT

The U.S. government has a paid-up license in this disclosure and the right in limited circumstances to require the patent owner to license others on reasonable terms as provided for by the terms of United States National Aeronautics and Space Administration (Contract No. NASA/NCC5-165) and the United States Department of the Navy (Contract No. Navy/N00014-98-1-0571).

FIELD OF THE INVENTION

The present disclosure relates to a method of synthesizing diamond. In particular, the present disclosure relates to a method of synthesizing diamond crystals and diamond films using plasma enhanced chemical vapor deposition.

BACKGROUND

Diamond synthesized by chemical vapor deposition ("CVD") has many unique and outstanding properties that make it an ideal material for a broad range of scientific and technological applications. A number of methods for diamond CVD are reported which utilize various gas mixtures and energy sources for dissociating the gas mixture. Such methods include the use of high temperature electrons in various kinds of plasma, high solid surfaces on hot filaments, and high temperature gases in combustion flames to dissociate molecules such as hydrogen, oxygen, halogen, hydrocarbon, and other carbon containing gases. Typically, a diamond crystal or film is grown on a substrate, which is usually maintained at a temperature much lower than that of electrons in the plasma, the heated surface of a hot filament, or the combustion flame. As a result, a super equilibrium of atomic hydrogen is developed near the diamond growing surface of the substrate.

Atomic hydrogen is believed to be crucial in the diamond CVD process. It is theorized that atomic hydrogen is effective in stabilizing the diamond growing surface and promoting diamond growth at a CVD temperature and pressure that otherwise thermodynamically favor graphite growth. Consistently, the reported diamond CVD processes involve the use of hydrogen gas or hydrogen containing molecules. The most typical diamond CVD process utilizes a precursor comprising of methane gas diluted by 94-99% hydrogen. With these CVD processes, the super equilibrium of atomic hydrogen can be achieved at a varied percentage of molecular hydrogen in the gas mixture. However, these CVD processes depend on the effectiveness of the dissociation process in generating atomic hydrogen.

Using a high power density microwave plasma to deposit diamond in a precursor comprising of a mixture of methane and hydrogen with less than 50% hydrogen has been reported. Growth of diamond from oxy-acetylene flames utilizes a precursor comprising acetylene and oxygen with a ratio of acetylene to oxygen slightly greater than 1 without additional molecular hydrogen being added. Diamond is deposited in the reducing "inner flame" where atomic hydrogen is a burn product produced by the high temperature flame. In addition to atomic hydrogen, there are plenty of OH radicals present near the diamond growing surface inside the flame.

OH and O radicals can play another role of atomic hydrogen in the diamond growth process. That is, preferential etching of non-diamond carbon, which results in a net deposition of high purity diamond. A small quantity of oxygen (0.5-2%) and/or water vapor (<6%) added to the methane and hydrogen precursor is reported to improve diamond crystallinity and lower the diamond CVD temperature. The quantity, whether small or large, of oxygen and/or water in a precursor or feedstock is a relative term depending on many other process parameters. Diamond has also been grown in a microwave plasma of a precursor comprising an acetone/oxygen mixture with a molecular ratio near 1:1.

Most of the diamond CVD processes involve the use of one or more compressed gases. Typically, such CVD processes utilize a compressed gas precursor comprising 1 vol % methane gas diluted by 99 vol % hydrogen. These gases usually must be precisely controlled by electronic mass flow controllers to ensure the accurate composition in the gas precursor feed.

In U.S. Pat. No. 5,480,686 to Rudder et al. ("Rudder") a method of diamond growth is disclosed that utilizes a radio frequency ("RF") plasma in a precursor comprising a mixture of water (more than 40%) and alcohol. No compressed gases are needed for this diamond CVD process. However, water has a low vapor pressure at room temperature, and condensation of water in the cooler part of the reactor manifold may be a concern. Also, water has a high freezing temperature making it easy to freeze at the orifice of a flow controller where liquid vaporizes and enters a low pressure reactor chamber. Buck et al. ("Buck"), ("Microwave CVD of diamond using methanol-rare gas mixtures," Materials Research Society Symposium Proceedings, Vol. 162, 97-102, 1989.) have grown clusters of diamond crystallites on small (2-4 $mm^2$) silicon substrates that were scratched with a diamond tip or mechanically polished with 3 μm diamond powder by microwave plasma enhanced CVD in pure methanol vapor. Argon gas additive was found necessary for high quality diamond to be deposited in the methanol vapor. When it is fully dissociated and reacted in the plasma, the pure methanol vapor plasma contains a C/O/H composition similar to that of $CO/H_2$ plasma, which has been used for successful deposition of diamond by means of electrical discharges.

In a typical electrical discharge such as a microwave plasma, electrons with an average temperature exceeding 10,000° C. are abundant. These energetic electrons effectively dissociate molecular species and generate a high concentration of radicals necessary for the deposition of diamond and the preferential etching of non-diamond deposits without needing a high temperature filament. Hot filament assisted CVD processes employ solid surfaces at a temperature of about 2,000° C.-2,500° C. to dissociate molecules and generate radicals necessary for diamond deposition. The hot filament temperature is much lower than that of energetic electrons in a plasma. As a consequence, hot-filament CVD of diamond in $CO/H_2$ mixtures has not been successful even though the same gas mixtures have been routinely used for plasma assisted deposition of diamond films.

Nevertheless, the plasma enhanced CVD method is desirable because diamond crystals and films can be deposited on large-area and/or irregularly shaped objects using inexpensive equipment. Thus, there remains a need for an economic method of synthesizing diamond utilizing plasma enhanced CVD.

SUMMARY

Briefly described, methods of forming diamond are described. A representative method, among others, includes: providing a substrate in a reaction chamber in a non-magnetic-field microwave plasma system; introducing, in the absence of a gas stream, a liquid precursor substantially free of water and containing methanol and at least one carbon and oxygen containing compound having a carbon to oxygen ratio greater than one, into an inlet of the reaction chamber; vaporizing the liquid precursor; and subjecting the vaporized precursor, in the absence of a carrier gas and in the absence in a reactive gas, to a plasma under conditions effective to disassociate the vaporized precursor and promote diamond growth on the substrate in a pressure range from about 70 to 130 Torr.

Another representative method of forming diamond includes: providing a substrate in a reaction chamber in a non-magnetic-field microwave plasma system, the reaction chamber being in fluidic communication with a container through a metering valve, wherein the container includes a liquid precursor substantially free of water containing methanol and at least one carbon and oxygen containing compound having a carbon to oxygen ratio greater than one; flowing the liquid precursor into the reaction chamber using the metering valve, in the absence of a gas stream flowing through the metering valve entraining the liquid precursor, wherein the liquid precursor vaporizes during entry into the reaction chamber; vaporizing the liquid precursor; subjecting the vaporized precursor to a plasma under conditions effective to disassociate the vaporized precursor in the absence of a carrier gas and in the absence in a reactive gas; and promoting diamond growth on the substrate at a pressure in the range from about 10 to 130 Torr.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of this disclosure can be better understood with reference to the following drawings. The components in the drawings are not necessarily to scale, emphasis instead being placed upon clearly illustrating the principles of the present invention.

DETAILED DESCRIPTION

Figure 1:
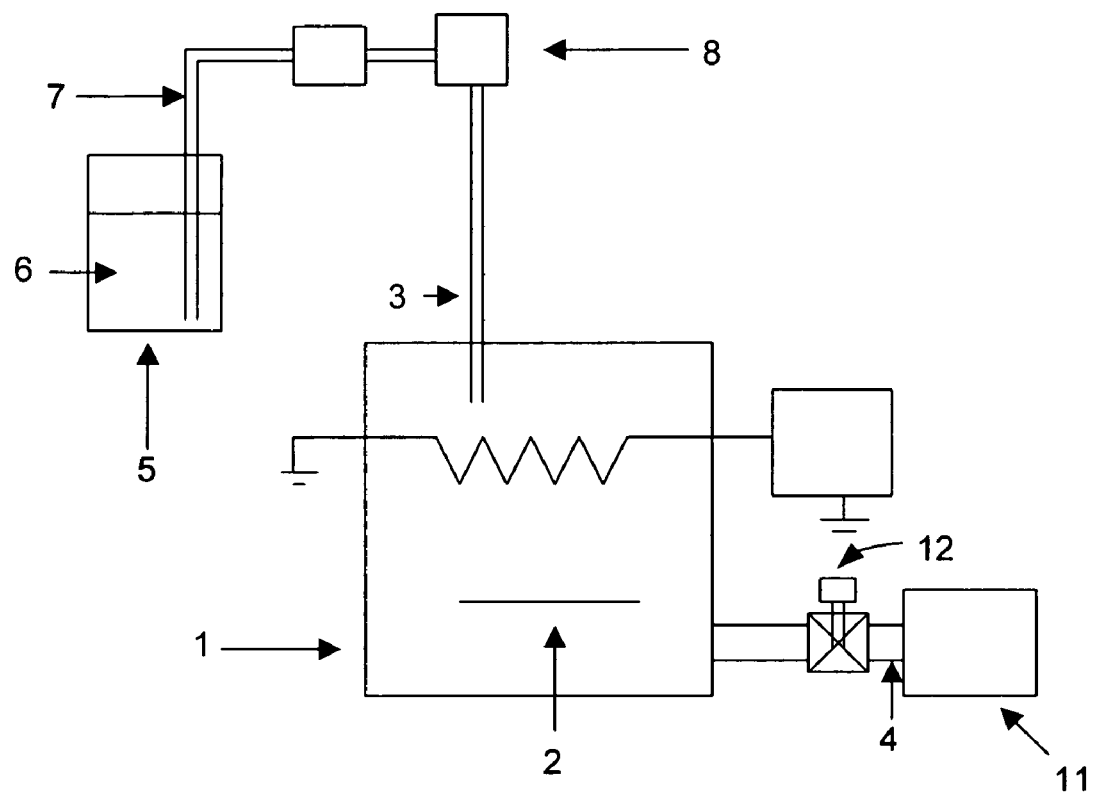
FIG. 1 is a schematic illustration of a microwave plasma enhanced chemical vapor deposition system made in accordance with the present disclosure.

For a more complete understanding of the present disclosure, reference should be made to the following detailed description taken in connection with the accompanying FIGURE.

The present disclosure relates to systems and methods of synthesizing diamond (e.g., crystals and/or diamond films) for a very broad range of scientific and technological applications such as optical windows, machining tools, heat spreaders, tribological coatings, sensors and actuators, electrochemical coatings, protective coatings, and wide-bandgap semiconductor devices. The systems and methods use a non-magnetic-field microwave plasma system. The systems and methods of the present disclosure use a premixed methanol-based liquid solution as the feedstock (e.g., precursor liquid). The methanol-based solution contains one or more carbon containing compounds with the molar ratio of atomic carbon to atomic oxygen being greater than one. The methanol-based solution includes methanol from about 50 to 96% by weight of the feedstock and is substantially free of water. The feedstock is introduced, in the absence of a gas stream entraining the feedstock, to a reaction chamber. Then, the feedstock is vaporized and subjected to a plasma, in the absence of a carrier gas (e.g., Argon) or a reactive gas (e.g., $H_2$), under conditions effective to disassociate the vaporized feedstock to promote diamond growth on a substrate. The pressure range for the system can be from about 10 to 130 Torr and from about 70 to 130 Torr.

FIG. 1 generally illustrates the plasma enhanced chemical vapor deposition system utilized in performing the methods of the present disclosure. As illustrated in FIG. 1, the precursor 5 is fed from a precursor container 6 by a conduit 7, such as a TEFLON or metal tubing, through a metering valve 8, such as a needle valve, to an inlet 3 of reactor chamber 1 in the absence of a gas stream.

The reactor chamber 1 is formed from a material capable of withstanding the temperature generated during the CVD process. In particular, the reactor chamber 1 is stainless steel and typically 8" in diameter. When the liquid precursor 5 enters the low pressure side of the metering valve 8 within the reactor chamber 1, it vaporizes to form a vapor precursor comprising a mixture with the same molar composition as the liquid precursor 5.

In addition to inlet 3, the reactor chamber 1 has an outlet 4 connected to a mechanical vacuum pump 11 through an automatically controlled throttle valve 12 to maintain constant pressure in the reaction chamber 1 throughout the deposition process and for circulating the vapor of the liquid precursor 5 through the reactor chamber 1. The vapor precursor is maintained at a pressure within the vacuum chamber 1 from about 10 Torr and 130 Torr, about 70 to 130 Torr, about 80 to 130 Torr, and, preferably 110 to 130 Torr, with the pressure being monitored by a pressure gauge (not shown).

The metering valve 8 can include a temperature measuring device (e.g., a thermocouple) coupled to the tip of the metering valve 8. The vaporization of the liquid precursor 5 causes the metering valve 8 to decrease in temperature to a temperature value. The temperature value is correlated to a flow rate of the liquid precursor 5, which in turn corresponds to a pressure in the reaction chamber 1 under constant conditions. Therefore, opening the metering valve 8 to an extent so that a known temperature value is obtained can substantially reproduce the corresponding flow rate of the liquid precursor 5 into the reaction chamber 1.

In one embodiment, the liquid precursor 5 can be disposed in a container, at atmospheric pressure. The liquid precursor 5 in the container can be replenished during the formation of the diamond without interrupting the formation.

In another embodiment, the container can be disposed within the system. In this regard, the liquid precursor 5 evaporates within the system to provide precursor vapor to form the diamond. The liquid precursor 5 can be replenished during the formation of the diamond without interrupting the formation.

Electromagnetic energy discharged at various frequencies, for example, DC, RF, and microwave, and also high frequency electromagnetic energy such as energy discharged from a laser, is applied to the reactor chamber 1. A window such as a quartz window that separates the low pressure reactor from ambient pressure and permit microwave energy to propagate into the reaction chamber 1. Preferably, the electromagnetic energy is microwave energy. The reactor chamber 1 is a part of the cylindrical cavity for the microwave of 2.45 GHz.

A substrate 2 is placed on a substrate holder, preferably a water-cooled substrate holder to control the temperature of and cool the substrate 2. The substrate 2 temperature is monitored with a dual color optical pyrometer (not shown). The vaporized precursor liquid passes across the substrate surface, in the absence of a carrier gas such as hydrogen ($H_2$), where the plasma dissociates the vapor precursor and releases OH, H, O, $CH_3$, $CH_2$, etc. radicals for a net deposition of diamond on a substrate surface.

Methanol vapor ($CH_3OH$) has a carbon to oxygen ratio equal to one. In the present disclosure, when methanol dissociates, it forms high concentrations of radicals that rapidly etch carbon, including diamond, resulting in slow growth of diamond in areas where a diamond deposition rate exceeds the etching rate. The growth rate and degree of non-uniformity also depend on the exposure of carbon, which may be present in some reactor fixtures or previously coated on reactor walls or the substrate holder, to the methanol plasma.

When the liquid precursor 5 comprises a solution of methanol and a known quantity of one or more carbon containing compounds having a carbon to oxygen ratio greater than one, diamond growth is substantially uniform, reproducible, and at a higher growth rate than with conventional CVD methods.

The carbon containing compound can include, but is not limited to, ethanol ($CH_3CH_2OH$), isopropanol (($CH_3$)$_2$CHOH), and acetone ($CH_3COCH_3$), which have respective carbon to oxygen ratios of 2, 3, and 3. The selection of the carbon containing compound is not limited to ethanol, isopropanol, or acetone, and may be selected from other such carbon containing compounds having carbon to oxygen ratios greater than one.

The feedstock can include methanol in amounts of about 50 to 96 weight percent of the feedstock, about 73 to 96 weight percent of the feedstock, and, preferably about 90 to 96 weight percent of the feedstock. The remaining portion of the feedstock includes one or more carbon containing compounds as described above. In particular, the feedstock can include ethanol, isopropanol, acetone, or combinations thereof, in an amount from about 4 to 50 weight percent of the feedstock, about 4 to 27 weight percent of the feedstock, and, preferably about 4 to 10 weight percent of the feedstock. Exemplary feedstock compositions and ratios of the components are described in Table 1.

If the precursor comprises only a carbon containing compound having carbon to oxygen ratios greater than one, suppression of the formation of non-diamond phases can generally be maintained by lowering the substrate temperature to below about 900° C. and/or selectively neucleating the substrate with high quality diamond particles. Also, diamond growth is also a function of the plasma density, reaction chamber pressure, carbon to oxygen ratio at the substrate surface, and precursor flow rate, and these functions are monitored and adjusted accordingly to promote diamond growth.

Furthermore, if it is desired for the diamond to contain a dopant, the carbon containing compound can include dopant elements or moieties in addition to C, O, and H, such as, but not limited to, boron, phosphorus, silicon, etc. Such dopants include, but are not limited to, halides, metals, and the like.

The substrate can include materials conventionally utilized in CVD processes. Useful substrate materials are capable of withstanding the temperatures generated during the plasma process. Examples of such substrates include, but are not limited to, a sheet or wafer of silicon, copper, aluminum, molybdenum, and alloys thereof. Further, the substrate may be either unseeded or seeded with diamond crystallites. Seeding can be accomplished by polishing the diamond-growing surface of the substrate with diamond paste containing diamond particles, such as 1 µm particles. It should be noted that diamond crystallites could be grown on aluminum at temperatures below that of the melting point of aluminum (e.g., Example 4 in Table 1). Also, diamond crystallites can be grown without seeding, which is difficult to do using other chemical vapor deposition systems (e.g., Examples 5 and 8 in Table 1).

In experiments conducted using the systems and methods of the present disclosure, the deposition process lasted for about 2 to 100 hours resulting in diamond films with well faceted diamond grains clearly visible using an optical microscope. The diamond grain sizes range from sub-micrometers to more than 500 µm.

An electromagnetic, such as microwave, plasma enhanced chemical vapor deposition technique using a precursor including methanol-based solutions as described above has been developed for the deposition of diamond. The OH, H, O radicals generated by the dissociation of the precursor vapor are shown to be sufficient in suppressing the growth of graphitic and amorphous carbon, which results in the net deposition of diamond by the carbon containing radicals that were dissociated from the same vapor. By the addition of carbon containing compounds having a carbon to oxygen ratio greater than one, to methanol, the diamond growth rate increases by orders of magnitude over that without the compound additives.

The aforementioned precursors are less costly than the typical compressed gases that are often used for diamond deposition. The precursors are much safer than the explosive gas mixtures containing a large proportion of hydrogen that are used by conventional diamond CVD deposition processes. Further, the mixing of a methanol-based solution can be performed under standard conditions (e.g., temperature and pressure) without the need for an expensive precision electronic mass flow controller.

EXAMPLES

A. Substrate Pre-Treatment and Cleaning

Substrates of silicon, aluminum, and molybdenum were cleaned by acetone and methanol before being loaded onto the substrate holder. Only Examples 5 and 7 were not polished with diamond paste containing 1 µm sized diamond particles.

B. Deposition Parameters

Typical deposition parameters are as follows:

| | |
|---|---|
| Microwave power | about 600-3000 W |
| Vapor pressure | about 10-130 Torr |
| Substrate temperature | about 300° C.-1600° C. |
| Methanol | about 50-96% by weight |
| Ethanol, isopropanol, and acetone | about 4-50% by weight |

C. Diamond Film Characterization Methods

A Normaski phase contrast optical microscope was used to examine the crystal shapes and surface morphology of the deposited films. Diamond grains with (100) or (111) facets can clearly be seen using this optical microscope. The diamond film thickness can also be measured by examining the cross-sectional view of such films using the same optical microscope. A micro Raman spectrometer powered by an Argon ion laser was used to examine the phase purity of the deposited films. Diamond peak around 1332 cm$^{-1}$ provided convincing evidence that the deposited carbon films were high-quality diamond.

D. Example Precursor Liquids

Table 1 provides exemplary examples to illustrate embodiments of the present disclosure but are not to be construed as limiting the scope of the present disclosure in any way.

Although this disclosure has been described in detail for the purpose of illustration, it is understood that such detail is solely for that purpose, and variations can be made therein by those skilled in the art without departing from the spirit and scope of the invention which is defined by the following claims.

I claim:

1. A method of forming diamond comprising:
   a) providing a substrate in a reaction chamber in a non-magnetic-field microwave plasma system;
   b) providing, in the absence of a gas stream, a liquid precursor substantially free of water and containing methanol and at least one carbon and oxygen containing compound having a carbon to oxygen ratio greater than one, to a metering valve associated with an inlet of the reaction chamber, wherein the amount of the methanol is greater than the amount of the at least one carbon and oxygen containing compound;
   c) passing liquid precursor into the reaction chamber inlet with the metering valve wherein the liquid precursor enters the metering valve as liquid and vaporizes during entry into the reaction chamber inlet to generate vaporized precursor; and
   d) subjecting the vaporized precursor, in the absence of a carrier gas and in the absence of a reactive gas, to a plasma under conditions effective to disassociate the vaporized precursor and promote diamond growth on the substrate in a pressure range from about 70 to 130 Torr.

2. The method of claim 1, wherein hydrogen gas ($H_2$) is not used in the reaction chamber.

3. The method of claim 1, wherein the pressure range is from 80 to 130 Torr.

4. The method of claim 1, wherein the pressure range is from 110 to 130 Torr.

5. The method of claim 4, wherein the methanol is from about 50 to 96 weight percent of the liquid precursor.

6. The method of claim 1, wherein the methanol is from about 50 to 96 weight percent of the liquid precursor.

7. The method of claim 1, wherein the methanol is from about 73 to 96 weight percent of the liquid precursor.

8. The method of claim 1, wherein the methanol is from about 90 to 96 weight percent of the liquid precursor.

9. The method of claim 1, wherein the at least one carbon and oxygen containing compound having a carbon to oxygen

TABLE 1

| Example | Methanol (g) | Ethanol (g) | Isoproponal (g) | Acetone (g) | Microwave Power (kW) | Vapor Pressure (Torr) | Temp (° C.) | Growth Rate (μm/hour) |
|---|---|---|---|---|---|---|---|---|
| 1 | 100 | 4.6 | — | — | 2 | 80 | 1000 | 1 |
| 2 | 100 | — | 4 | — | 2 | 80 | 1000 | 2 |
| 3 | 100 | — | — | 3.5 | 2 | 60 | 1030 | 1.3 |
| 4 | 100 | — | — | 15 | 0.65/0.8 | 11/16 | 335/613 | — |
| 5 | 100 | — | — | 50 | 1.1 | 35 | 724 | 2 |
| 6 | 100 | — | — | 50 | 1.1 | 29 | 800 | — |
| 7 | 100 | — | 100 | — | 1 | 36 | 754 | 2.7 |
| 8 | 100 | — | — | 7.01 | 3 | 80 | 1000 | 3.6 |
| 9 | 100 | — | — | 5 | 1.7 | 40 | 900 | — |
| 10 | 100 | — | 15 | — | 1.3 | 50 | 1030 | — |
| 11 | 100 | — | 10 | — | 2 | 70 | 960 | 3.4 |
| 12 | 100 | — | 15 | — | 1.5 | 50 | 969 | 2.5 |
| 13 | 100 | — | 15 | — | 1 | 35 | 745 | — |
| 14 | 100 | — | — | 50 | 1.5 | 37 | 724 | 1.75 |
| 15 | 100 | — | — | 9.35 | 2.8 | 111 | 1280 | 5 |
| 16 | 100 | — | — | 9.35 | 2.8 | 111 | 1273 | 6.5 |
| 17 | 100 | — | — | 7.01 | 1.8 | 110 | 1242 | 3.3 |
| 18 | 100 | — | — | 7.01 | 1.8 | 80 | 1199 | 4 |
| 19 | 100 | — | — | 4.67 | 1.8 | 80 | 1140 | 2.4 |
| 20 | 100 | — | — | 4.67 | 1.2 | 40 | 1000 | 1.2 |
| 21 | 100 | — | 100 | — | 1.3 | 50 | 975 | 8 |
| 22 | 100 | — | 10 | — | 2.6 | 130 | — | — |
| 23 | 100 | 30 | — | — | 1.7 | 42 | 970 | — | ratio greater than one are selected from ethanol, acetone, isopropanol, and combinations thereof.

10. A method of forming diamond comprising:
  a) providing a substrate in a reaction chamber in a non-magnetic-field microwave plasma system, the reaction chamber being in fluidic communication with a container through a metering valve, wherein the container includes a liquid precursor substantially free of water containing methanol and at least one carbon and oxygen containing compound having a carbon to oxygen ratio greater than one, wherein the amount of the methanol is greater than the amount of the at least one carbon and oxygen containing compound;
  b) flowing the liquid precursor into the reaction chamber using the metering valve, in the absence of a gas stream flowing through the metering valve entraining the liquid precursor, wherein the liquid precursor enters the metering valve as liquid and vaporizes during entry into the reaction chamber;
  c) subjecting the vaporized precursor to a plasma under conditions effective to disassociate the vaporized precursor in the absence of a carrier gas and in the absence of a reactive gas; and
  d) promoting diamond growth on the substrate at a pressure in the range from about 10 to 130 Torr.

11. The method of claim 10, wherein the methanol is from about 50 to 96 weight percent of the liquid precursor, and wherein the pressure range is from 70 to 130 Torr.

12. The method of claim 10, wherein the methanol is from about 73 to 96 weight percent of the liquid precursor, and wherein the pressure range is from 110 to 130 Torr.

13. The method of claim 10, wherein the methanol is from about 90 to 96 weight percent of the liquid precursor, and wherein the pressure range is from 110 to 130 Torr.

14. The method of claim 10, wherein hydrogen gas ($H_2$) is not used in the reaction chamber.

15. The method of claim 14, wherein the at least one carbon and oxygen containing compound having a carbon to oxygen ratio greater than one is ethanol.

16. The method of claim 14, wherein the at least one carbon and oxygen containing compound having a carbon to oxygen ratio greater than one is acetone.

17. The method of claim 14, wherein the at least one carbon and oxygen containing compound having a carbon to oxygen ratio greater than one is isopropanol.

18. The method of claim 10, wherein the substrate does not include a pre-deposition seeding of diamond particles on the surface of the substrate.

19. The method of claim 10, wherein the substrate is aluminum.

20. The method of claim 10, wherein the metering valve includes a temperature measuring device coupled to the tip of the metering valve, wherein the vaporization of the liquid precursor causes the metering valve to decrease in temperature to a temperature value, wherein the temperature value is correlated to a flow rate of the liquid precursor, wherein the flow rate of the liquid precursor into the reaction chamber can be controlled by opening the metering valve to an extent so that the temperature value is obtained.

21. The method of claim 20, wherein the container includes a volume of the precursor liquid at atmospheric pressure, wherein the liquid precursor is adapted to be replenished during the formation of the diamond without interrupting the formation thereof.

22. The method of claim 10, wherein flowing the liquid precursor into the reaction chamber is controlled by monitoring the metering valve and adjusting a flow of the liquid precursor to maintain a substantially constant temperature.

23. A method of forming diamond without seeding comprising:
  a) providing an unseeded substrate in a reaction chamber in a non-magnetic-field microwave plasma system, the reaction chamber being in fluidic communication with a container through a metering valve, wherein the container includes a liquid precursor substantially free of water containing methanol and at least one carbon and oxygen containing compound having a carbon to oxygen ratio greater than one, wherein the amount of the methanol is greater than the amount of the at least one carbon and oxygen containing compound;
  b) supplying the liquid precursor into the reaction chamber without interrupting formation of the diamond using the metering valve, in the absence of a gas stream flowing through the metering valve entraining the liquid precursor, wherein the liquid precursor enters the metering valve as liquid and vaporizes during entry into the reaction chamber;
  c) subjecting the vaporized precursor to a plasma under conditions effective to disassociate the vaporized precursor in the absence of a carrier gas and in the absence of a reactive gas; and
  d) promoting diamond growth on the substrate at a pressure in the range from about 10 to 130 Torr.

* * * * *

UNITED STATES PATENT AND TRADEMARK OFFICE
CERTIFICATE OF CORRECTION

| | |
|---|---|
| PATENT NO. | : 7,622,151 B2 |
| APPLICATION NO. | : 10/772740 |
| DATED | : November 24, 2009 |
| INVENTOR(S) | : Yonhua Tzeng |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 414 days.

Signed and Sealed this

Twenty-sixth Day of October, 2010

David J. Kappos
*Director of the United States Patent and Trademark Office*